United States Patent [19]
Grenon et al.

[11] 3,932,927
[45] Jan. 20, 1976

[54] SCANNABLE LIGHT EMITTING DIODE ARRAY AND METHOD

[75] Inventors: Lawrence A. Grenon, Phoenix; Michael G. Coleman, Tempe, both of Ariz.

[73] Assignee: Motorola, Inc., Chicago, Ill.

[22] Filed: Mar. 29, 1974

[21] Appl. No.: 456,117

Related U.S. Application Data
[62] Division of Ser. No. 337,818, March 5, 1973.

[52] U.S. Cl. ...................... 29/577; 29/589; 357/50; 29/580
[51] Int. Cl.² .......................................... B01J 17/00
[58] Field of Search .......... 29/577, 580, 569 L, 589; 357/50

[56] References Cited
UNITED STATES PATENTS

| | | | |
|---|---|---|---|
| 3,448,344 | 6/1969 | Schuster | 29/569 |
| 3,500,139 | 3/1970 | Frouin | 357/50 |
| 3,768,150 | 10/1973 | Sloan | 29/580 |

OTHER PUBLICATIONS
IBM Technical Disclosure Bulletin, Blum, Vol. 13, No. 9, Feb. 1971, p. 2494.

*Primary Examiner*—W. Tupman
*Attorney, Agent, or Firm*—Harry M. Weiss; Henry T. Olsen

[57] ABSTRACT

There is disclosed a method of manufacturing the foregoing which comprises placing an epitaxial layer of a first conductivity type semiconductor material upon a substrate of semiconductor material having an intrinsic or semi insulating conductivity. Then channels are etched through the epitaxial layer to the semi insulating semiconductor substrate, thereby forming the epitaxial material into a plurality of parallel ribs or ridges. After coating the entire surface of the channels and the ridges with a dielectric layer, a conductive material is deposited over the substrate to fill the channels with the conductive material which may be either a metal or polycrystalline silicon doped to have sufficient conductivity. The surface of the substrate is then lapped to remove the conductive material and the dielectric material from the ridges to expose the first semiconductor material, and following diffusion of a dopant to convert the first semiconductor material to a second conductivity type material thereby forming a PN junction in each of the ridges in spaced locations therealong, suitable metallization is placed on the substrate to connect the first conductivity material to the conductive material in the channels to form column lines and metallization is placed on top a dielectric layer to connect the other conductivity material in a plurality of row lines.

2 Claims, 6 Drawing Figures

SCANNABLE LIGHT EMITTING DIODE ARRAY AND METHOD

This is a division of application Ser. No. 337,818, filed Mar. 5, 1973.

BACKGROUND OF THE INVENTION

This invention relates to alpha numeric displays and more particularly to a monolithic light emitting diode display. More particularly, the invention is related to a light emitting diode display which is scannably addressable.

Visual readout devices such as alpha numeric displays are available on several formats utilizing various light emitting devices such as incandescent lamps, gaseous discharge lamps, electroluminescent displays and more recently light emitting diode arrays. Such devices are utilized for many purposes, such as computer readouts, process control instrumentation, aircraft and automotive instrument panels and various other indicators such as clocks and gauges. Since most, if not all of the aforementioned uses, rely on semiconductor electronics, it is highly desirable that the alpha numeric display be compatible with the voltages and currents normally utilized in such semiconductor circuits and be compatible with its speed of operation. The major objection to the presently most widely used visual readout, the gas discharge lamp of the cathode glow variety, is the high voltage required for initiating the glow discharge. Such readouts require the use of interface semiconductors having high reverse voltage breakdown characteristics. Obviously, the light emitting diode array format, being itself a semiconductor device, is highly desirable for a visual readout since it is inherently compatible with the electronics of the semiconductor circuits.

Some attempts have been made to provide alpha numeric displays utilizing light emitting diodes in either discrete, hybrid or individually addressable diode bit arrays. In these formats, light emitting diode arrays have not been widely acceptable as they are costly, unreliable and relatively inconvenient to adapt to standard systems.

SUMMARY OF THE INVENTION

It is a primary object of this invention to provide a monolithic light emitting diode alpha numeric display device and method of making the same.

A further object of the invention is to provide a monolithic light emitting diode alpha numeric display which is relatively economic and compatible with standard systems.

In accordance with the aforementioned objects, there is provided a monolithic light display comprising a matrix of light emitting diodes in an integral structure, said light emitting diodes being arranged in columns and rows. An isolation channel and a supporting carrier isolates the rows of diodes, which rows have a common electrode. If the resistance of the common electrode is too high for electrical connection merely at the ends, a conductive bus in the isolation channel may form access for connection for either the row or column lines to permit a strobing format, logic address system to effect light emission of the individual diodes to produce an alpha numeric character. There is further provided a method of manufacturing the foregoing monolithic light display structure.

THE DRAWINGS

Further objects and advantages of the invention will be obvious to one skilled in the art from the following complete description thereof and from the drawings wherein.

DETAILED DESCRIPTION

While the following preferred embodiment of the invention is disclosed with particular reference to a monolithic array of gallium arsenide phosphide light emitting diodes, it will be appreciated that any optimum light emitting diode material such as gallium arsenide or gallium phosphide may be used. The carrier substrate for the array may be of any suitable material sufficiently matching the crystal structure of the gallium arsenide phosphide to permit monocrystalline epitaxial growth thereon, the particular selection of material being based on several criteria. It will be further appreciated in accordance with the invention, that the substrate may be a composite of semiconductors, metals or insulating materials. For example, one of the current limiting values for a light emitting diode and hence light output, will be based upon the heat or power dissipation characteristic of the substrate. For maximum dissipation of heat from the light emitting diode, a laminated carrier with a metal conductor backing carrier having good power and heat dissipating characteristics would be desirable so that the light emitting diodes could be operated up to a maximum intensity. However, monocrystalline growth of the epitaxial layer may be accomplished most easily when the carrier is of the same monocrystalline material as the epitaxial layer, but having a semi insulating electrical conductivity. Thus, for dissipating heat from the body it may be desirable after completion of manufacture of the array to reduce the thickness of the backing carrier before mounting on a suitable header or housing which will provide for heat dissipation.

Figure 1:
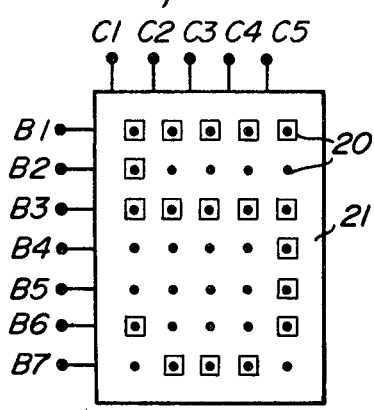
FIG. 1 is a plan view of a monolithic light emitting diode array in accordance with the preferred embodiment of the invention depicted somewhat schematically.

In accordance with the preferred embodiment of the invention as shown in FIG. 1, the light emitting diode array comprises a plurality of light emitting diodes 20 arranged in a monolithic support structure 21 in an orthagonal matrix of rows and columns. As shown, the matrix comprises five light emitting diodes in each row and seven light emitting diodes in each column for a total of 35 light emitting diodes 20 comprising the array. Contacts B1–B7 are provided making contact with the anodes of each of the rows of light emitting diodes and contacts C1–C5 are provided for contacting the cathodes of the light emitting diodes in each column. Thus, a suitable strobing or scanning type logic matrix can individually address the light emitting diodes to cause each to emit light in a suitable alpha numeric pattern indicated by the aura around various of the light emitting diodes being depicted as indicating the numeral "5". Each column is addressed during a particular clock pulse of the logic matrix, and suitable of the light emitting diodes will be switched to emit light by addressing the desired anode through the row contacts. The crossing conductive paths comprising the column contact C1–C5 and the row contacts B1–B7 will be explained hereinafter in greater detail.

Figure 2:
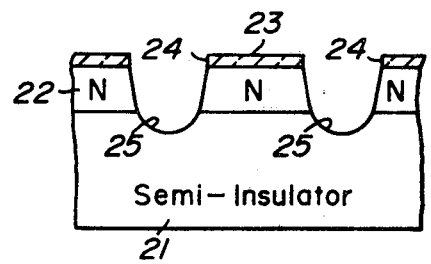
FIGS. 2–5 are cross sectional views depicting schematically in enlarged scale successive stages in the manufacture of the light emitting diode array.
Figure 3:
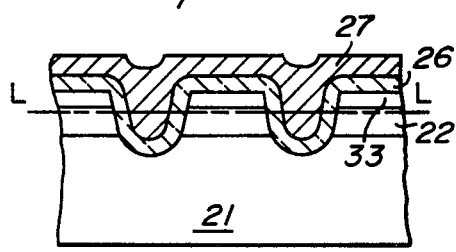
Figure 4:
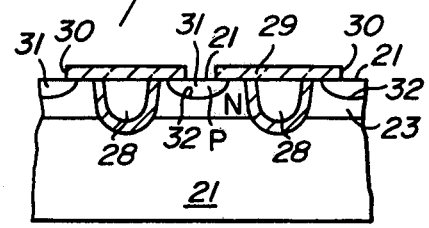

The successive steps in the manufacturing of the light emitting diode array is depicted in FIG. 2–5 which method has as its primary purpose the obtaining of an orthagonal matrix of light emitting diodes utilizing a minimum number of processing steps. As shown in FIG. 2, a substrate 21 of monocrystalline semiconductor material, preferably semi insulating or P-conductivity gallium arsenide, is first covered with a layer of suitable semiconductor material by an epitaxial process to form monocrystalline semiconductor material covering the substrate 21. This epitaxial layer is preferably of gallium arsenide phosphide. A masking layer 23 of any suitable material such as silicon dioxide, is deposited upon the epitaxial layer 22 and by the use of suitable photolithographic techniques, windows 24 opened therein. The masking layer 23, with the windows 24, then serves as an etch mask for opening the channels 25 in the epitaxial layer. As depicted, it was noted that the channels are etched sufficiently deep to pass entirely through the epitaxial N-conductivity layer into the substrate 21, thus dividing the N-conductivity layer 22 into a plurality of parallel ridges.

The etched surface of the structure is then covered with a suitable dielectric layer 26 (FIG. 3) over which is deposited a suitable layer 27 of preferably conductive material. The layer 27 may be of any suitable dielectric or conductive material sufficient to fill the isolation channel 25, but in accordance with the preferred embodiment, the material is a conductor such as doped polycrystalline silicon or a metal to form a conductive bus for column address purposes. This conductive bus is only necessary if the resistance of the N-conductivity layer is too high to permit access at the ends of the ridges. The surface of the substrate is then lapped to the lapline L—L to remove layers 27, 26 and 23 from the ridges of N-conductivity material. A portion of the N-conductivity material 22 may be also removed to further control the thickness of the layer of epitaxial material.

Figure 5:
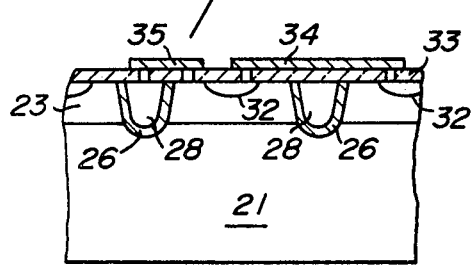

Following the lapping of the surface, a new masking layer 29 is deposited on the surface, and by suitable photolithographic techniques, windows 30 opened therein to define diffusion areas in the ridges of N-conductivity material. Following a suitable deposition and diffusion step, the P-regions 31 are formed in the ridges 22, defining a PN junction 32. The junctions are spaced along the ridges, thereby defining rows of light emitting diodes 21 electrically isolated from each other by the isolation channels 25, and by either a PN junction with the support or the supports' semi insulating conductivity, and columns of light emitting diodes 21 arranged in sequence in the ridges 22. Windows may be opened in layer 29 or following removal of the dielectric masking layer 29, a new dielectric layer 33 is deposited on the surface of the substrate and a suitable photomask and metallization step forms contacts 34 to the anodes of the light emitting diodes 21 and contacts 35 to connect portions of the cathodes of the light emitting diodes 21 to the conductive bus 28. It is to be noted that the cross section depicted in FIG. 5 is taken along line 5—5 of FIG. 6 so as to depict both the anode and the cathode contact.

Figure 6:
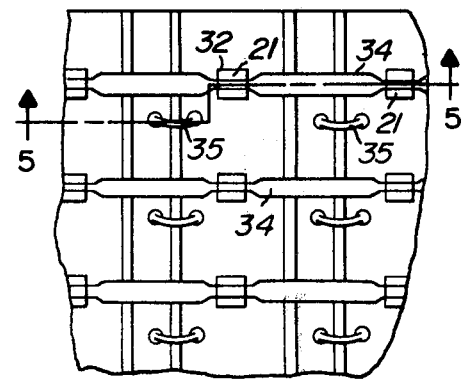
FIG. 6 is a top plan view of a portion of the array on this enlarged scale.

A plan view of the final structure in enlarged form is depicted in FIG. 6 wherein it is to be noted that the contacts 34 extend in rows to define the row address bus while being narrowed at 34a to decrease the amount of light reflected from the light emitting diode junction. It is to be further noted that the resultant structure, all of the photo diodes 21 in a particular column are of a common cathode connected since the P-diffusions are arranged within a single ridge for each column. Thus, if the conductivity of the N-conductivity ridge 22 is sufficiently high, the contacts 35 and conductive bus 28 may not be necessary to define the column address system and contact made only to a portion of the ridge.

It is thus seen there is disclosed a monolithic XY addressable light emitting diode array which may be manufactured with a minimum number of processing steps so as to be economically manufactured in a reliable, reproducible manner. While a five by seven array has been disclosed particularly, any suitable sized matrix may be used.

While the preferred embodiment of the invention has been given by way of a specific disclosure thereof, it is obvious that suitable changes and modifications can be made therein, without departing from the spirit and scope of the invention.

What is claimed is:

1. A method of manufacturing a monolithic light emitting diode display comprising:
   depositing an epitaxial layer of a first conductivity semiconductor material upon the substrate;
   etching channels through said epitaxial layer to the substrate to form a plurality of parallel ridges;
   coating the surface of the channels and the ridges with a dielectric material;
   filling said channels with a conductive material;
   electrically connecting said conductive material to at least one portion of said ridge to form an electrical connection to one side of said PN junction;
   removing said conductive material and said dielectric from the surface of the ridges; and
   diffusing an opposite conductivity affecting material into a plurality of spaced locations in each of said ridges to form an othagonal matrix of PN junctions in the surface of the epitaxial layer.

2. A method as recited in claim 1 and further including the step of forming a pattern of metallization on the surface generally perpendicular to said conductive channel to electrically connect the other side of said PN junction in a plurality of rows.

* * * * *